(12) United States Patent
Suh

(10) Patent No.: US 8,410,483 B2
(45) Date of Patent: Apr. 2, 2013

(54) ORGANIC LIGHT-EMITTING DISPLAY DEVICE AND METHOD OF MANUFACTURING THE SAME

(75) Inventor: Min-Chul Suh, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/137,001

(22) Filed: Jul. 14, 2011

(65) Prior Publication Data

US 2012/0012848 A1    Jan. 19, 2012

(30) Foreign Application Priority Data

Jul. 19, 2010  (KR) .......................... 10-2010-0069603

(51) Int. Cl.
*H01L 27/32* (2006.01)
*H01L 51/56* (2006.01)

(52) U.S. Cl. ................. 257/59; 257/40; 257/72; 257/88; 257/E51.018; 257/E27.119; 313/500; 313/504; 313/505

(58) Field of Classification Search ............ 257/40, 257/59, 72, 88, E51.018, E27.119; 313/500, 313/504, 505
See application file for complete search history.

(56) References Cited

U.S. PATENT DOCUMENTS

| | | | |
|---|---|---|---|
| 2003/0098645 A1 | 5/2003 | Lee et al. | |
| 2003/0201445 A1* | 10/2003 | Park et al. | 257/79 |
| 2005/0140290 A1* | 6/2005 | Park et al. | 313/512 |
| 2006/0055313 A1* | 3/2006 | Bae et al. | 313/500 |
| 2008/0315755 A1* | 12/2008 | Han | 313/504 |

FOREIGN PATENT DOCUMENTS

| | | |
|---|---|---|
| JP | 2005-072002 A | 3/2005 |
| JP | 2006-338946 A | 12/2006 |
| JP | 2010-123474 A | 6/2010 |
| KR | 2003-0042937 A | 6/2003 |
| KR | 10 2005-0070402 A | 7/2005 |
| KR | 10 2006-00371 A | 5/2006 |
| KR | 10 2006-00568 A | 5/2006 |
| KR | 10-0833773 B1 | 5/2008 |

OTHER PUBLICATIONS

Korean Notice of Allowance in KR 10-2010-0069603, dated Oct. 22, 2012 (SUH).

* cited by examiner

*Primary Examiner* — Kenneth Parker
*Assistant Examiner* — Yu Chen
(74) *Attorney, Agent, or Firm* — Lee & Morse, P.C.

(57) ABSTRACT

An organic light-emitting display device and method of manufacturing the same, the device including a first substrate; a second substrate facing the first substrate; an organic light-emitting unit formed by laser-induced thermal imaging, the organic light emitting unit being on the first substrate; a coupling member coupling the first substrate and the second substrate; and a supporting element on the first substrate, the supporting element having a height greater than a height of a thickest portion of the organic light-emitting unit and less than a height of the coupling member.

7 Claims, 6 Drawing Sheets

ORGANIC LIGHT-EMITTING DISPLAY DEVICE AND METHOD OF MANUFACTURING THE SAME

BACKGROUND

1. Field

Embodiments relate to an organic light-emitting display device and a method of manufacturing the same.

2. Description of the Related Art

Organic light-emitting devices are flat panel display devices having a structure including, e.g., an anode, a cathode, and an intermediate layer including at least an organic emission layer between the anode and the cathode. Organic light-emitting devices may have a wide viewing angle, a high contrast ratio, and high response speeds and are regarded as a next-generation display device. Organic light-emitting devices may further include, in addition to the organic emission layer, at least one organic layer including, e.g., a hole injection layer, a hole transport layer, an electron transport layer, and/or an electron injection layer, depending on a material for forming an organic emission layer, e.g., a polymer organic material or a low molecular weight organic material.

In organic light-emitting devices, in order to embody a full color, the organic layers may be patterned. The patterning may be performed using, e.g., a shadow mask, ink-jet printing, or laser-induced thermal imaging (LITI). LITI may be especially suitable for delicate patterning of organic layers, large areas, and high-definition.

SUMMARY

Embodiments are directed to an organic light-emitting display device and a method of manufacturing the same.

At least one of the above and other features and advantages may be realized by providing an organic light-emitting display device including a first substrate; a second substrate facing the first substrate; an organic light-emitting unit formed by laser-induced thermal imaging, the organic light emitting unit being on the first substrate; a coupling member coupling the first substrate and the second substrate; and a supporting element on the first substrate, the supporting element having a height greater than a height of a thickest portion of the organic light-emitting unit and less than a height of the coupling member.

The supporting element may be separated from the organic light-emitting unit by a first distance, the coupling member may be separated from the organic light emitting unit by a second distance, and the first distance may be shorter than the second distance, whereby the supporting element is located nearer the organic light-emitting unit than the coupling member.

The organic light-emitting unit may include a pixel circuit unit on the first substrate; an insulating portion covering the pixel circuit unit; a pixel electrode on the insulating portion, the pixel electrode being connected to the pixel circuit unit; a pixel defining layer on the insulating portion, the pixel defining layer having an opening exposing the pixel electrode; an intermediate layer on the pixel electrode, the intermediate layer being configured to generate light; and an opposite electrode on the intermediate layer, wherein the intermediate layer is formed by laser-induced thermal imaging.

The pixel circuit unit may correspond to the pixel electrode on the first substrate.

The pixel circuit unit may include a thin-film transistor or interconnection lines.

A height from a top surface of the first substrate to a top surface of the pixel electrode may be greater than a height from the top surface of the first substrate to a top surface of the pixel defining layer.

A height of the supporting element may be greater than the height from the top surface of the first substrate to the top surface of the pixel electrode.

The intermediate layer may be formed by laser-induced thermal imaging, and the supporting element may be configured to support a donor film and to prevent premature attachment of the donor film onto the pixel electrode when the first substrate is laminated with the donor film.

The intermediate layer may include a low molecular weight material.

At least one of the above and other features and advantages may also be realized by providing a method of manufacturing an organic light-emitting display device by laser-induced thermal imaging, the method including preparing an acceptor substrate; forming a supporting element adjacent to an edge of the acceptor substrate; laminating the donor film on the acceptor substrate, the donor film being supported by the supporting element and including a transfer layer; transferring a portion of the transfer layer of the donor film onto the acceptor substrate; delaminating the donor film and the acceptor substrate; and coupling the acceptor substrate to an encapsulation substrate with a coupling member.

The coupling member may be disposed outside the supporting element.

The supporting element may have a height greater than a height of a thickest portion of the acceptor substrate and less than a height of the coupling member.

The acceptor substrate may include a plurality of emission regions and a plurality of non-emission regions.

A portion of the acceptor substrate of one of the emission regions may be thicker than the acceptor substrate of one of the non-emission regions adjacent to the one emission region.

A height of the supporting element may be greater than a height of a thickest portion of the acceptor substrate in the one emission region and less than a height of the coupling member.

Laminating the donor film on the acceptor substrate may include preventing premature attachment of the transfer layer to the one emission region by the donor film being supported by the supporting element.

The acceptor substrate may include a pixel circuit unit on the first substrate; an insulating portion covering the pixel circuit unit; a pixel electrode on the insulating portion, the pixel electrode being connected to the pixel circuit unit; and a pixel defining layer on the insulating portion, the pixel defining layer having an opening exposing the pixel electrode.

The pixel circuit unit may correspond to the pixel electrode on the first substrate.

The pixel circuit unit may include a thin-film transistor or interconnection lines.

A height from a top surface of the first substrate to a top surface of the pixel electrode may be greater than a height from the top surface of the first substrate to a top surface of the pixel defining layer.

A height of the supporting element may be greater than the height from the top surface of the first substrate to a top surface of the pixel electrode and less than a height of the coupling member.

Laminating the donor film on the acceptor substrate may include preventing premature attachment of the transfer layer onto the pixel electrode when the donor film is laminated on the first substrate by the donor film being supported by the supporting element.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
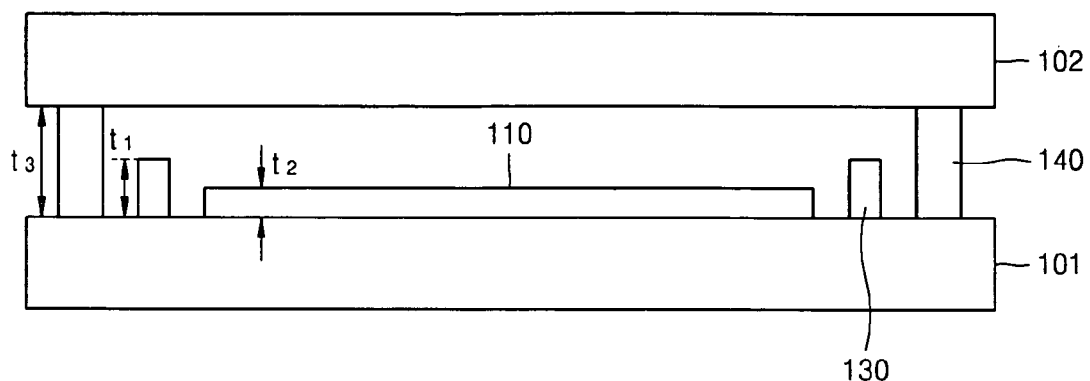
FIG. 1 illustrates a schematic sectional view of an organic light-emitting display device according to an embodiment.

Korean Patent Application No. 10-2010-0069603, filed on Jul. 19, 2010, in the Korean Intellectual Property Office, and entitled: "Organic Light-Emitting Display Device and Method of Manufacturing the Same," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

It will be understood that, although the terms first, second, third, etc., may be used herein to describe various elements, these elements should not be limited by these terms. These terms are only used to distinguish one element from another element.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "includes," when used in this specification, specify the presence of stated features, integers, steps, operations, elements, and/or components, but do not preclude the presence or addition of one or more other features, integers, steps, operations, elements, components, and/or groups thereof.

Figure 2:
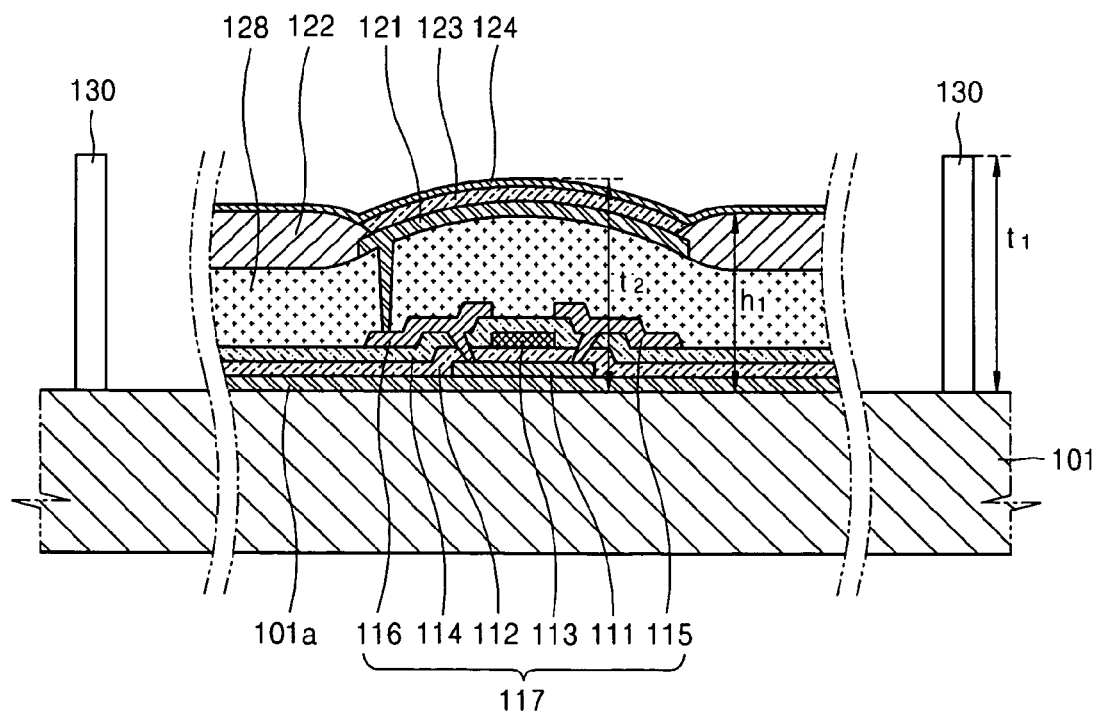
FIG. 2 illustrates a schematic sectional view of an organic light-emitting unit and a supporting element of FIG. 1.

FIG. 1 illustrates a schematic sectional view of an organic light-emitting display device according to an embodiment. FIG. 2 illustrates a schematic sectional view of an organic light-emitting unit 110 and a supporting element 130 of FIG. 1.

Referring to FIGS. 1 and 2, the organic light-emitting display device according to the present embodiment may include a first substrate 101, a second substrate 102, an organic light-emitting unit 110, a supporting element 130, and a coupling member 140.

The organic light-emitting unit 110 may be formed on the first substrate 101. The first substrate 101 may be, e.g., a glass substrate or a plastic substrate such as an acryl substrate. Alternatively, the first substrate 101 may be instead a metal plate. In an implementation, the first substrate 101 may include a buffer layer 101a thereon.

The buffer layer 101a may include an insulating material having barrier characteristics. For example, the buffer layer 101a may include $SiO_2$ or $SiN_x$.

The first substrate 101 on which the organic light-emitting unit 110 may be formed may be coupled to the second substrate 102 by the coupling member 140. Like the first substrate 101, the second substrate 102 may be, e.g., a glass substrate or a plastic substrate such as an acryl substrate.

The organic light-emitting unit 110 may include a pixel circuit unit 117, an insulating portion 128, a pixel electrode 121, a pixel defining layer 122, an intermediate layer 123, and an opposite electrode 124.

The pixel circuit unit 117 may be disposed on the first substrate 101. The pixel circuit unit 117 may include, e.g., a thin-film transistor (TFT) and/or interconnection lines.

The pixel circuit unit 117, e.g., a TFT, may include an active layer 111, a gate insulating layer 112, a gate electrode 113, an interlayer insulating layer 114, and source and drain electrodes 115 and 116. As illustrated in FIG. 2, the pixel circuit unit 117 may be a top gate TFT, but the embodiments are not limited thereto. For example, the pixel circuit unit 117 may be a bottom gate TFT.

The active layer 111 having a predetermined pattern may be formed on the buffer layer 101a of the first substrate 101. The gate insulating layer 112 may be formed on the active layer 111; and the gate electrode 113 may be formed on a portion of the gate insulating layer 112. The gate electrode 113 may be connected to a gate line (not shown) through which signals for turning on or off the TFT may be applied. The interlayer insulating layer 114 may be formed on the gate electrode 113; and the source and drain electrodes 115 and 116 may contact the activation layer 111 through contact holes.

The insulating portion 128 may be formed on the source and drain electrodes 115 and 116. The insulating portion 128 may be a passivation layer including, e.g., $SiO_2$ or $SiN_x$. In an implementation, the insulating portion 128 may further include a planarization layer (not shown) on the passivation layer. The planarization layer may include an organic material, e.g., acryl, polyimide, or benzocyclobutene (BCB). The insulating portion 128 may include, e.g., a monolayer formed of an inorganic material or an organic material or may have a multi-layer structure including inorganic layers or organic layers.

The pixel electrode 121, which may function as an anode of an organic light-emitting device (OLED), may be formed on the insulating portion 128. The pixel defining layer 122 formed of, e.g., an organic material, may cover ends of the pixel electrode 121. An opening may be formed in the pixel defining layer 122 and the intermediate layer 123 may be formed on the pixel defining layer 122 as well as a portion of the pixel electrode 121 exposed by the opening. The intermediate layer 123 may include an emission layer. However, the embodiments are not limited to the structure described above; and any of a variety of structures of OLEDs may be instead used herein.

The OLED may display image information by emitting red light, green light, or blue light in response to a current applied thereto. The OLED may include the pixel electrode 121 that is connected to the drain electrode 116 of the TFT and may receive a positive power source from the drain electrode 116. The OLED may include the opposite electrode 124 that covers all pixels and provides a negative power source. The OLED may include the intermediate layer 123 that is interposed between the pixel electrode 121 and the opposite electrode 124 and emits light.

The pixel electrode 121 and the opposite electrode 124 may be electrodes through which voltages with different polarities are applied to the intermediate layer 123 so that the intermediate layer 123 may emit light.

The intermediate layer 123 may include, e.g., a low molecular weight organic layer or a polymer organic layer. When the intermediate layer 123 includes a low molecular weight organic layer, the intermediate layer 123 may include an emission layer (EML) and a monolayer including at least one of, e.g., a hole injection layer (HIL), a hole transport layer (HTL), an electron transport layer (ETL), and an electron injection layer (EIL) or a multi-layer structure including at least one of, e.g., a HIL, a HTL, an ETL, and an EIL. The low molecular weight organic material may include, e.g., copper phthalocyanine (CuPc), N,N'-dinaphthalene-1-yl-N,N'-diphenyl-benzidine (NPB), or tris(8-hydroxyquinoline)aluminum (Alq3). The low molecular weight organic layer may be formed by, e.g., vacuum deposition.

When the intermediate layer 123 includes a polymer organic layer, the intermediate layer 123 may include a HTL and an EML. In an implementation, the HTL may be formed of, e.g., PEDOT, and the EML may be formed of, e.g., polyphenylenevinylene (PPV) and polyfluorene. The HTL and the EML may be formed by, e.g., screen printing or ink-jet printing.

The intermediate layer 123 is not limited to those described above; and other, e.g., structures and/or materials, may also be applied to the intermediate layer 123.

The pixel electrode 121 may function as an anode and the opposite electrode 124 may function as a cathode. Alternatively, the pixel electrode 121 may function as a cathode and the opposite electrode 124 may function as an anode.

The pixel electrode 121 may be, e.g., a transparent electrode or a reflective electrode. When the pixel electrode 121 is a transparent electrode, the pixel electrode 121 may include, e.g., ITO, IZO, ZnO, or $In_2O_3$. When the pixel electrode 121 is a reflective electrode, the pixel electrode 121 may be formed by forming a reflective portion including, e.g., Ag, Mg, Al, Pt, Pd, Au, Ni, Nd, Ir, Cr, or a mixture thereof, and then depositing, e.g., ITO, IZO, ZnO, or $In_2O_3$, on the reflective portion.

Also, the opposite electrode 124 may be a reflective electrode or a transparent electrode. When the opposite electrode 124 is a transparent electrode, the opposite electrode 124 may function as a cathode. Thus, the opposite electrode 124 may be formed by depositing a metal having a low work function, e.g., Li, Ca, LiF/Ca, LiF/Al, Al, Ag, Mg, or a mixture thereof, in a direction facing the intermediate layer 123. Then an auxiliary electrode layer or a bus electrode line may be formed thereon using a material for forming a transparent electrode, e.g., ITO, IZO, ZnO, or $In_2O_3$. When the opposite electrode 124 is a reflective electrode, the opposite electrode 124 may be formed by blanket deposition using, e.g., Li, Ca, LiF/Ca, LiF/Al, Al, Ag, Mg, or a mixture thereof.

The supporting element 130 may be spaced apart from an edge of the organic light-emitting unit 110 and may be disposed closer to the organic light-emitting unit 110 than the coupling member 140. In other words, the supporting member 130 may be between the organic light-emitting unit 110 and the coupling member 140 or the supporting element 130 may be separated from the organic light-emitting unit 110 by a first distance, the coupling member 140 may be separated from the organic light emitting 110 unit by a second distance, and the first distance may be shorter than the second distance.

A height t1 of the supporting element 130 may be greater than a height t2 of a thickest portion of the organic light-emitting unit 110 and less than a height t3 of the coupling member 140.

As described above, the height t1 of the supporting element 130 may be greater than the height t2 of the thickest portion of the organic light-emitting unit 110. Thus, when the intermediate layer 123 is formed by, e.g., laser-induced thermal imaging, the supporting element 130 may support a donor film (see 150 of FIG. 4) to prevent premature attachment of a transfer layer (see 151 of FIG. 4) of the donor film to the thickest portion of the organic light-emitting unit 110 before transferring, as will be described in detail below. In addition, the supporting element 130 may support a donor film 150 during transferring to prevent undesirable attachment of the transfer layer 151 to non-light emitting regions of the display device.

The supporting element 130 and the pixel defining layer 122 may be formed of the same material. In an implementation, the supporting element 130 may be formed during a process for forming the pixel defining layer 122. When a halftone mask is used, the supporting element 130 and the pixel defining layer 122 may be formed in the same process. However, the embodiments are not limited thereto; and the supporting element 130 and the pixel defining layer 122 may be formed of different materials in different processes. The height t1 of the supporting element 130 may be greater than a height h1 of the organic light-emitting unit 110 from a surface of the substrate 101 to a surface, e.g., an upper surface, of the pixel defining layer 122.

FIGS. 3 through 7 illustrate sectional views of stages in a method of manufacturing the organic light-emitting display device of FIG. 2 by laser-induced thermal imaging.

Figure 3:
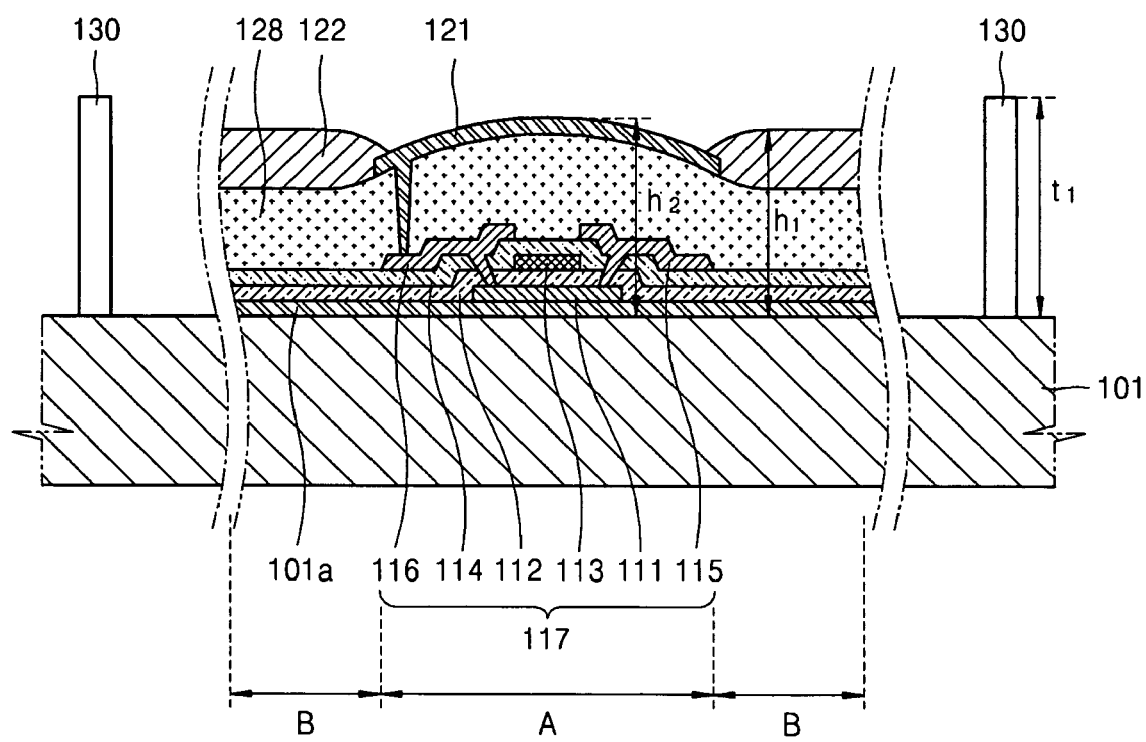
FIGS. 3 through 7 illustrate sectional views of stages in a method of manufacturing the organic light-emitting display device of FIG. 2 by laser-induced thermal imaging.

Referring to FIG. 3, an acceptor substrate Acc including the supporting element 130 may be prepared. The acceptor substrate Acc may be a substrate to which the transfer layer 151 of the donor film 150 is to be transferred when the organic light-emitting display device is manufactured by laser-induced thermal imaging. As illustrated in FIG. 3, the acceptor substrate Acc may include, e.g., portions of the first substrate 101 and the buffer layer 101a, the pixel circuit unit 117, the insulating portion 128, the pixel defining layer 122, and the pixel electrode 121, which may be formed on the first substrate 101.

The first substrate 101 may be divided into a plurality of emission regions A and a plurality of non-emission regions B. In the emission regions A, the pixel electrode 121 and the intermediate layer (see 123 of FIG. 2) may be deposited to form part of the OLED for generating light. In the non-emission region B, the pixel defining layer 122 may be formed, e.g., in an area where light is not to be generated. The pixel circuit unit 117 or various interconnection lines (not shown) may be disposed on the first substrate 101. Thus, a top surface of the acceptor substrate Acc may not be even or flat. For example, as illustrated in FIG. 3, when the pixel circuit unit 117 is disposed in one of the emission regions A, the pixel electrode 121 corresponding to the emission region A may not be even. In this case, a height h2 of the acceptor substrate Acc in the emission region A may be greater than the height h1 of the acceptor substrate Acc in the non-emission region B. For example, the height h2 from the top surface of the first substrate 101 to a top surface of the pixel electrode 121 may be greater than the height h1 from the top surface of the first substrate 101 to the top surface of pixel defining layer 122. As described above, if the height h2 is greater than the height h1 due to, e.g., the pixel circuit unit 117 or various interconnection lines, when the acceptor substrate Acc is laminated with the donor film 150, premature transfer of the transfer layer 151 of the donor film 150 to a thickest portion of the acceptor substrate Acc before desired transfer of the transfer layer to the acceptor substrate Acc may be prevented. In addition, in a delamination process after the transferring, undesired transfer and/or attachment of the transfer layer to other portions of the acceptor substrate Acc or detachment of an intermediate transfer layer (see 151a of FIG. 6) from the acceptor substrate Acc may be prevented.

In the present embodiment, the supporting element 130 may have a height t1 greater than a height h2 of the thickest portion of the acceptor substrate Acc and may support the donor film 150. Thus, premature attachment or undesirable detachment of the intermediate transfer layer 151a in the lamination process or the delamination process may be prevented.

Figure 4:
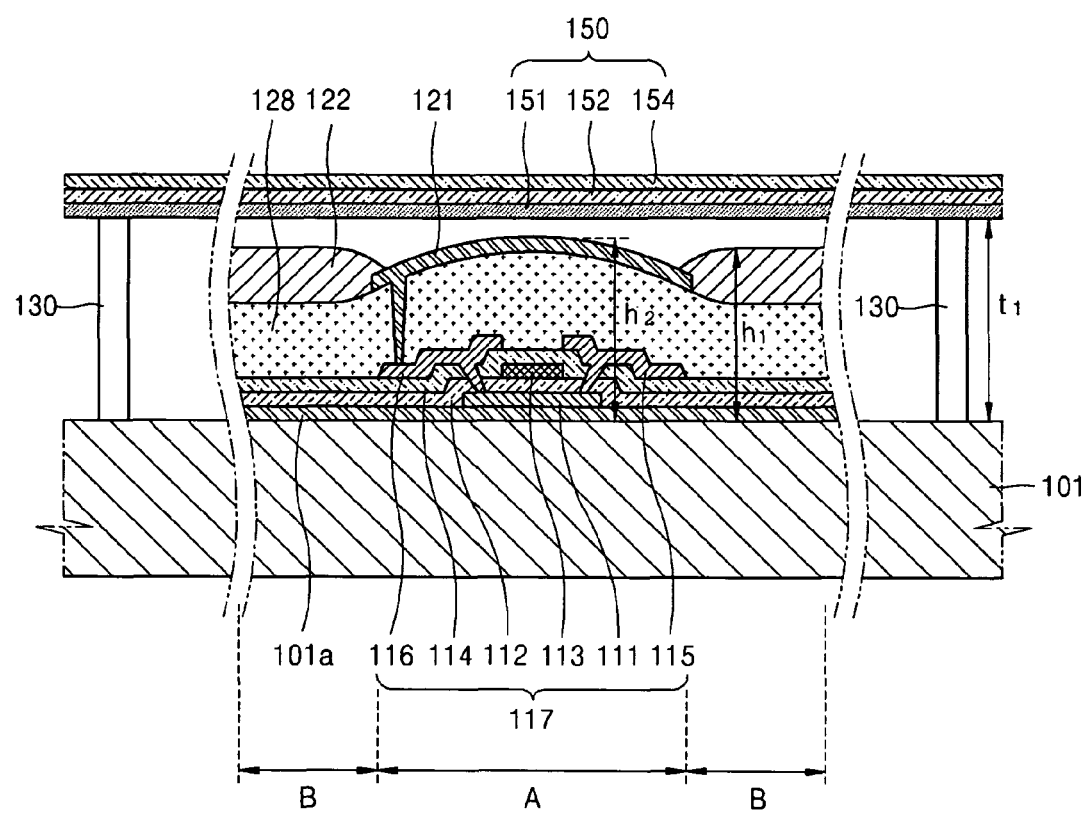

FIG. 4 illustrates a process of laminating the acceptor substrate Acc with a donor film 150.

As illustrated in FIG. 4, the donor film 150 may include, e.g., a base film 154 and a photothermal conversion layer 152 and transfer layer 151 may be sequentially deposited in the order stated on a surface of the base film 154. The donor film 150 may exhibit elasticity. The base film 154 may be formed of a transparent polymer organic material, e.g., poly(ethylene terephthalate) (PET), polyethylene naphthalate (PEN), polyethylene (PE), or polycarbonate (PC). The photothermal conversion layer 152 may be a layer that converts incident light into heat. The photothermal conversion layer 152 may be formed of a light-absorbing material, e.g., aluminum oxide, aluminum sulfide, carbon black, graphite, or ultraviolet dye. When the acceptor substrate Acc is an organic light-emitting device substrate, the transfer layer 151 may be an organic transfer layer, e.g., a material for forming the intermediate layer 123. The organic transfer layer 151 may include at least one of, e.g., a HIL, a HTL, an EML, a HBL, an ETL, and an EIL.

When the acceptor substrate Acc is laminated with the donor film 150, the supporting element 130 may have a height t1 greater than the height h2 or the height h1. Thus, the donor film 150 may be supported by the supporting element 130; and premature attachment of the transfer layer 151 to the pixel electrode 121 and/or the pixel defining layer 122 before transferring may be prevented.

Figure 5:
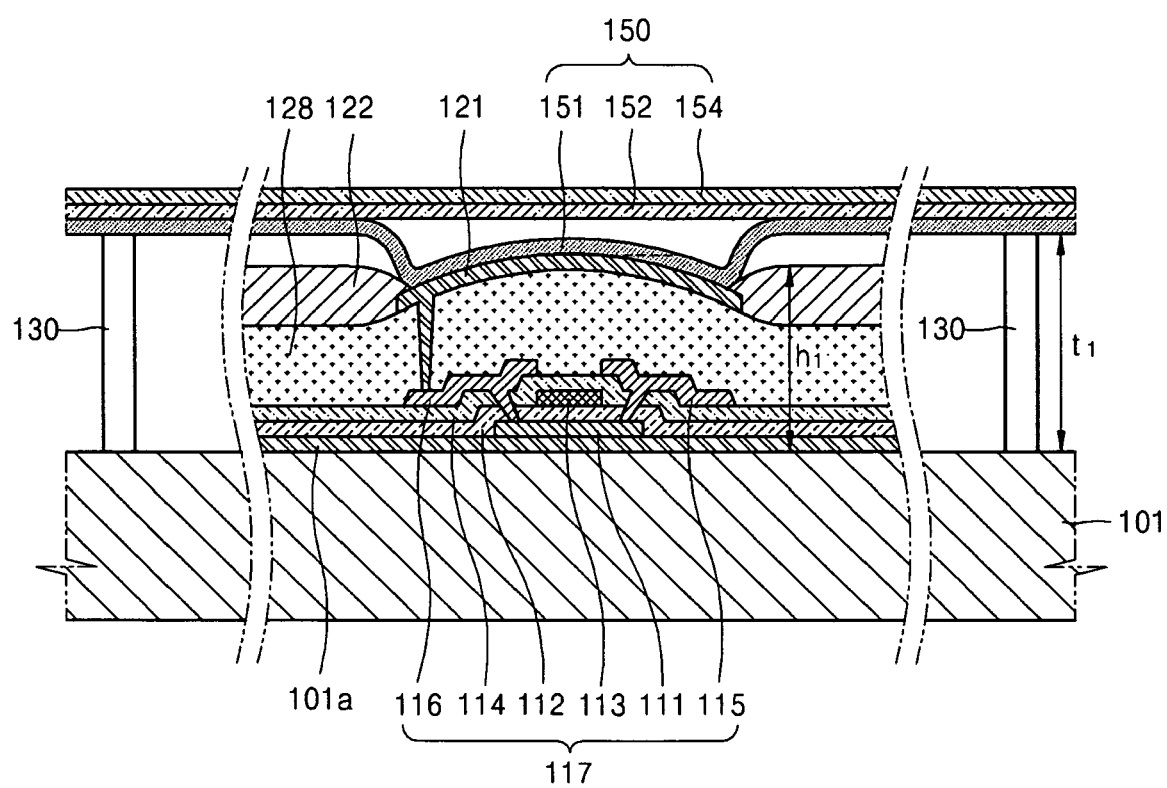

FIG. 5 illustrates a process of transferring the transfer layer 151 of the donor film 150 onto the acceptor substrate Acc.

Referring to FIG. 5, in a state in which the acceptor substrate Acc is laminated with the donor film 150, a laser may be irradiated only to a region of the transfer layer 151 of the donor film 150 that is to be transferred. When the laser is irradiated, the photothermal conversion layer 152 may expand towards the acceptor substrate Acc. Thus, the transfer layer 151 may expand correspondingly and a portion of the transfer layer 151 corresponding to the region of the photothermal conversion layer 152 exposed to the laser irradiation may be separated from the donor film 150 and transferred to the acceptor substrate Acc. For example, a portion of the transfer layer 151 separated from the donor film 150 may be transferred to the pixel electrode 121.

Figure 6:
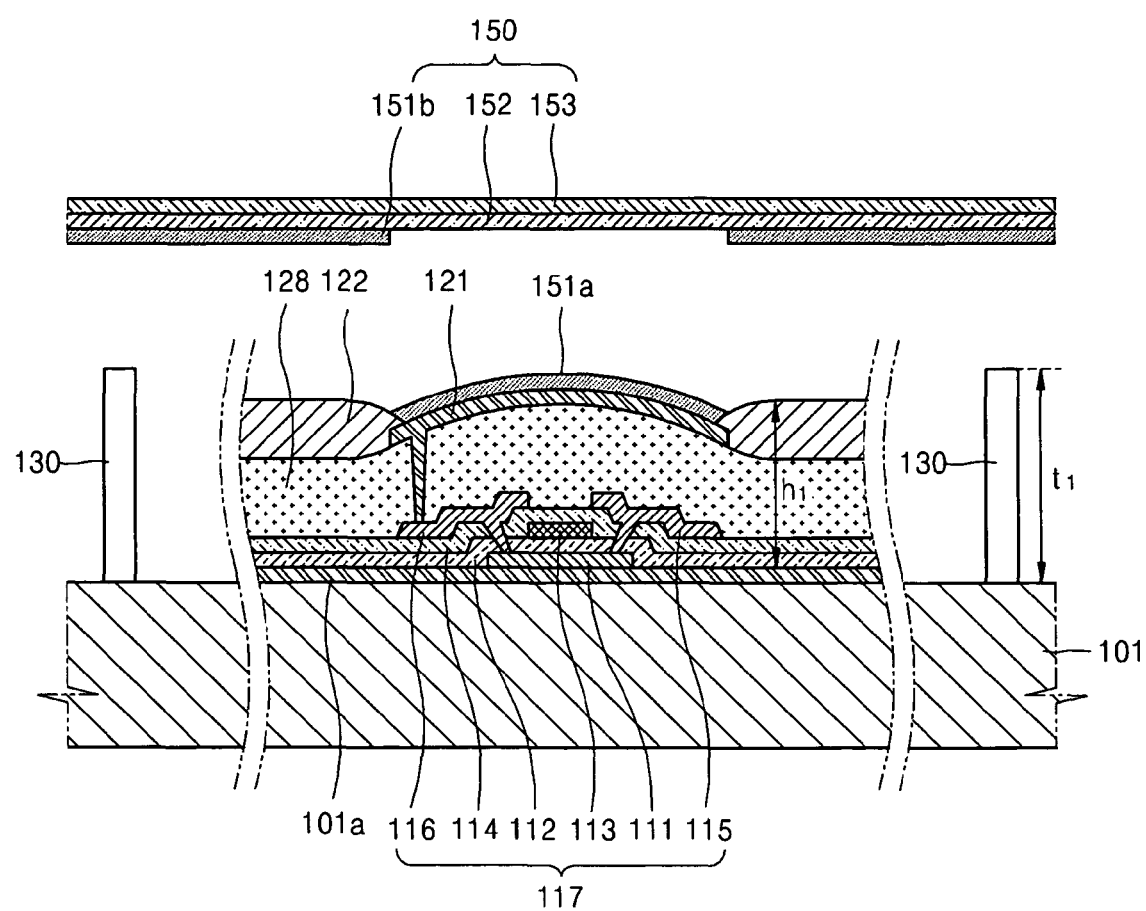

FIG. 6 illustrates a delamination process for separating the donor film 150 from the acceptor substrate Acc.

Referring to FIG. 6, when the intermediate transfer layer 151a is transferred to the acceptor substrate Acc, the donor film 150 may be separated from the acceptor substrate Acc. The intermediate transfer layer 151a may remain on the pixel electrode 121 to form the intermediate layer 123; and a remaining transfer layer 151b that is not exposed to the laser irradiation may remain in the donor film 150.

Figure 7:
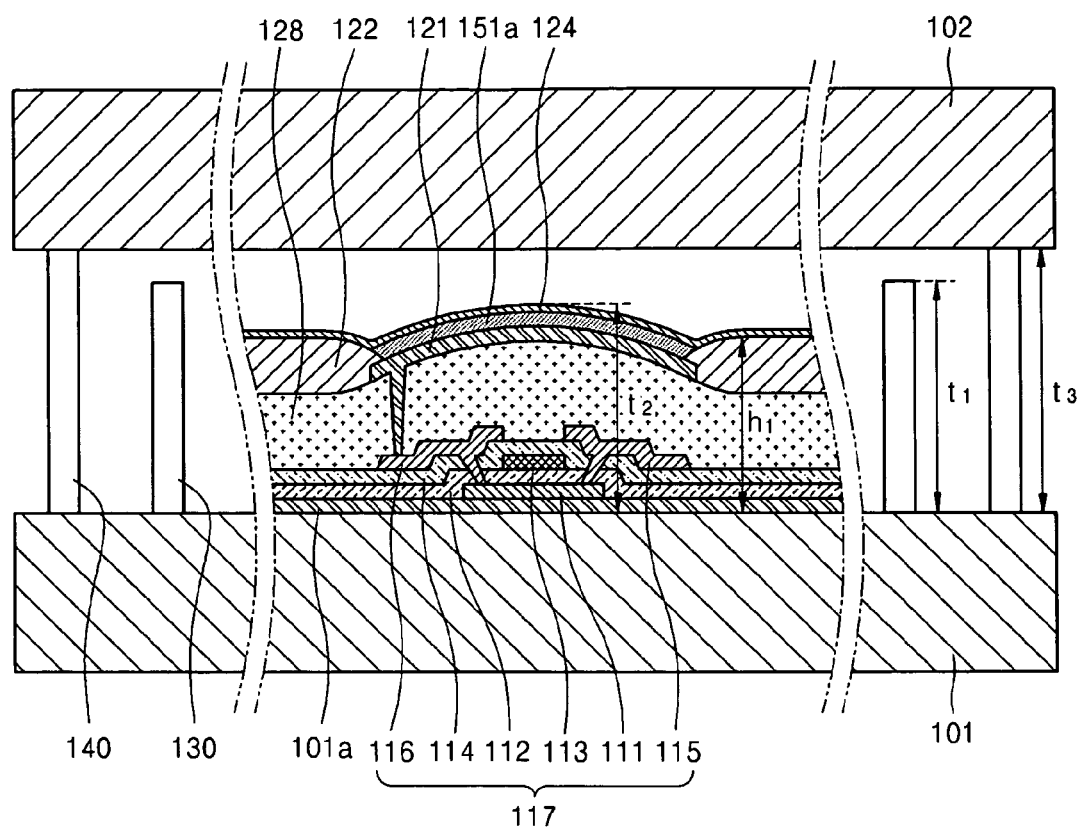

FIG. 7 illustrates a process for forming the opposite electrode 124 and the second substrate 102.

Referring to FIG. 7, the opposite electrode 124 may cover the intermediate transfer layer 151a (i.e., the intermediate layer 123) on the pixel electrode 121. For example, the intermediate transfer layer 151a interposed between the pixel electrode 121 and the opposite electrode 124 may form the intermediate layer (see 123 of FIG. 2). For example, the pixel electrode 121 and the opposite electrode 124 may be electrodes through which voltages with different polarities are applied to the intermediate transfer layer 151a (i.e., the intermediate layer 123) so that the intermediate transfer layer 151a (i.e., the intermediate layer 123) may emit light.

After formation of the opposite electrode 124, the first substrate 101 may be coupled to the second substrate 102 with the coupling member 140. The coupling member 140 may be formed of, e.g., sealant or fit. The height t3 of the coupling member 140 may be greater than the height t1 of the supporting element 130.

According to the embodiments, when an organic light-emitting display device is manufactured by laser-induced thermal imaging, undesirable premature attachment of a transfer layer of a donor film to an acceptor substrate in a lamination process may be prevented.

In particular, the embodiments provide an organic light-emitting display device capable of preventing premature attachment of a transfer layer of a donor film to an acceptor substrate when the acceptor substrate is laminated with the transfer layer during manufacturing of the organic light-emitting display device by laser-induced thermal imaging.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:
1. An organic light-emitting display device, comprising:
a first substrate;
a second substrate facing the first substrate;
an organic light-emitting unit formed by laser-induced thermal imaging, the organic light emitting unit being on the first substrate;
a coupling member coupling the first substrate and the second substrate; and
a supporting element on the first substrate, the supporting element having a height greater than a height of a thickest portion of the organic light-emitting unit and less than a height of the coupling member;
wherein the organic light-emitting unit includes:
a pixel circuit unit on the first substrate;
an insulating portion covering the pixel circuit unit;
a pixel electrode on the insulating portion, the pixel electrode being connected to the pixel circuit unit;
a pixel defining layer on the insulating portion, the pixel defining layer having an opening exposing the pixel electrode;
an intermediate layer on the pixel electrode, the intermediate layer being configured to generate light; and
an opposite electrode on the intermediate layer,
wherein the intermediate layer is formed by laser-induced thermal imaging; and
wherein a height from a top surface of the first substrate to a top surface of the pixel electrode is greater than a height from the top surface of the first substrate to a top surface of the pixel defining layer.

2. The organic light-emitting display device as claimed in claim 1, wherein the supporting element is separated from the organic light-emitting unit by a first distance, the coupling member is separated from the organic light emitting unit by a second distance, and the first distance is shorter than the second distance, whereby the supporting element is located nearer the organic light-emitting unit than the coupling member.

3. The organic light-emitting display device as claimed in claim 1, wherein the pixel circuit unit corresponds to the pixel electrode on the first substrate.

4. The organic light-emitting display device as claimed in claim 3, wherein the pixel circuit unit includes a thin-film transistor or interconnection lines.

5. The organic light-emitting display device as claimed in claim 1, wherein a height of the supporting element is greater than the height from the top surface of the first substrate to the top surface of the pixel electrode.

6. The organic light-emitting display device as claimed in claim 1, wherein:
   the intermediate layer is formed by laser-induced thermal imaging, and
   the supporting element is configured to support a donor film and to prevent premature attachment of the donor film onto the pixel electrode when the first substrate is laminated with the donor film.

7. The organic light-emitting display device as claimed in claim 1, wherein the intermediate layer includes a low molecular weight material.

* * * * *